United States Patent [19]

Viza et al.

[11] Patent Number: 5,098,008

[45] Date of Patent: Mar. 24, 1992

[54] FINE PITCH LEADED COMPONENT PLACEMENT PROCESS

[75] Inventors: Daniel J. Viza, Sunrise; Christopher M. Kerlin, Plantation; Barry B. Groman, Sunrise, all of Fla.

[73] Assignee: Motorola, Inc., Schaumburg, Ill.

[21] Appl. No.: 647,092

[22] Filed: Jan. 29, 1991

[51] Int. Cl.$^5$ .............................................. B23K 31/02
[52] U.S. Cl. ................................... 228/180.2; 228/159; 228/6.2
[58] Field of Search ................... 228/159, 180.2, 6.2

[56] References Cited

U.S. PATENT DOCUMENTS

| | | | |
|---|---|---|---|
| 4,380,042 | 4/1983 | Angelucci, Sr. et al. | 228/159 |
| 4,399,610 | 8/1983 | Moyer | 228/180.2 X |
| 4,479,298 | 10/1984 | Hug | 228/6.2 X |
| 4,511,201 | 4/1985 | Baker et al. | 339/75 |
| 4,705,205 | 11/1987 | Allen et al. | 228/180.2 |
| 4,728,022 | 3/1988 | Jamison | 228/56.3 |
| 4,761,880 | 8/1988 | Stankus et al. | 29/840 |
| 4,826,068 | 5/1989 | Yagoura et al. | 228/6.2 X |
| 4,857,027 | 8/1989 | Makita et al. | 228/159 X |
| 4,979,663 | 12/1990 | Sofia et al. | 228/180.2 |

*Primary Examiner*—Richard K. Seidel
*Assistant Examiner*—Patty E. Hong
*Attorney, Agent, or Firm*—Juliana Agon

[57] ABSTRACT

A method of mounting an integrated circuit carrier (10) having a plurality of straight leads (12) retained by an integral frame (16) is provided. The plurality of straight leads (12) of the carrier (10) is bent to form a plurality of bent leads (12) still retained by the frame (16). The plurality of bent leads are then scored to form a notch (32) on each bent lead. Solder fluxing, placing, and reflowing the plurality of bent leads of the integrated circuit carrier against corresponding printed lines of the printed circuit (26) surface before each notch follow. Finally, a remainder portion of the plurality of leads from and including the frame (16) to the notch (32) on each lead (12) is removed.

9 Claims, 2 Drawing Sheets

FINE PITCH LEADED COMPONENT PLACEMENT PROCESS

TECHNICAL FIELD

This invention relates generally to the mounting of multileaded integrated circuit (IC) or chip carriers to printed circuit boards (PCBs) or substrates and more particularly to mounting such carriers having a retaining ring or frame which is retained through the entire soldering process.

BACKGROUND

Leaded integrated circuit (IC) or chip carriers have come into common use to provide a means of physically and electrically coupling integrated circuits to a surface such as printed circuit boards (PCBs) or substrates. The fine wire leads of such carriers are typically spaced very closely and are therefore examples of fine pitch leaded components. The close spacing of the leads create problems in soldering the leads to the printed wires of the PCB or substrate without inadvertently breaking the leads or displacing the leads.

Current manufacturing practices in handling fine pitch leaded chip carriers utilize one of two processes to cut and form the leads prior to placement of the device. One method is to cut and form at the chip packager's site then transport the devices in trays. The parts are then picked and placed from the trays using a robot or a functional equivalent. The second method is to deliver the parts from the chip packager's site for use in a tape pack form where a retaining ring or frame is still in place. Conventionally, the ring is sheared and the leads are formed at the assembly site where the chip carrier is to be mounted on the PCB or substrate. The device or chip carrier is then placed and reflowed on site without the ring. The problem with the current methods is that there is a potential for lead damage to occur from handling prior to the parts being placed and soldered. This damage potential is due to the loss of rigidity in the leads that the retaining ring provides.

It would therefore represent an advance in the art to provide a means for reliably retaining the ring of the chip carrier throughout the entire soldering process to prevent lead damage.

SUMMARY OF THE INVENTION

Accordingly, it is an advantage of the present invention to achieve rigidity in the leads by retaining the ring of a chip carrier throughout the soldering process.

Briefly, according to the invention, a method of mounting an integrated circuit carrier having a plurality of straight leads retained by an integral frame, comprises the following steps:

bending the plurality of straight leads of the carrier to form a plurality of bent leads still retained by the frame;

scoring a portion of the plurality of bent leads to form a notch on each bent lead;

solder fluxing, placing, and reflowing the plurality of bent leads of the integrated circuit carrier against corresponding printed lines on the printed circuit surface before each notch; and removing a remainder portion of the plurality of leads from and including the frame to the notch on each lead.

DETAILED DESCRIPTION OF THE PREFERRED EMBODIMENT

Figure 1:
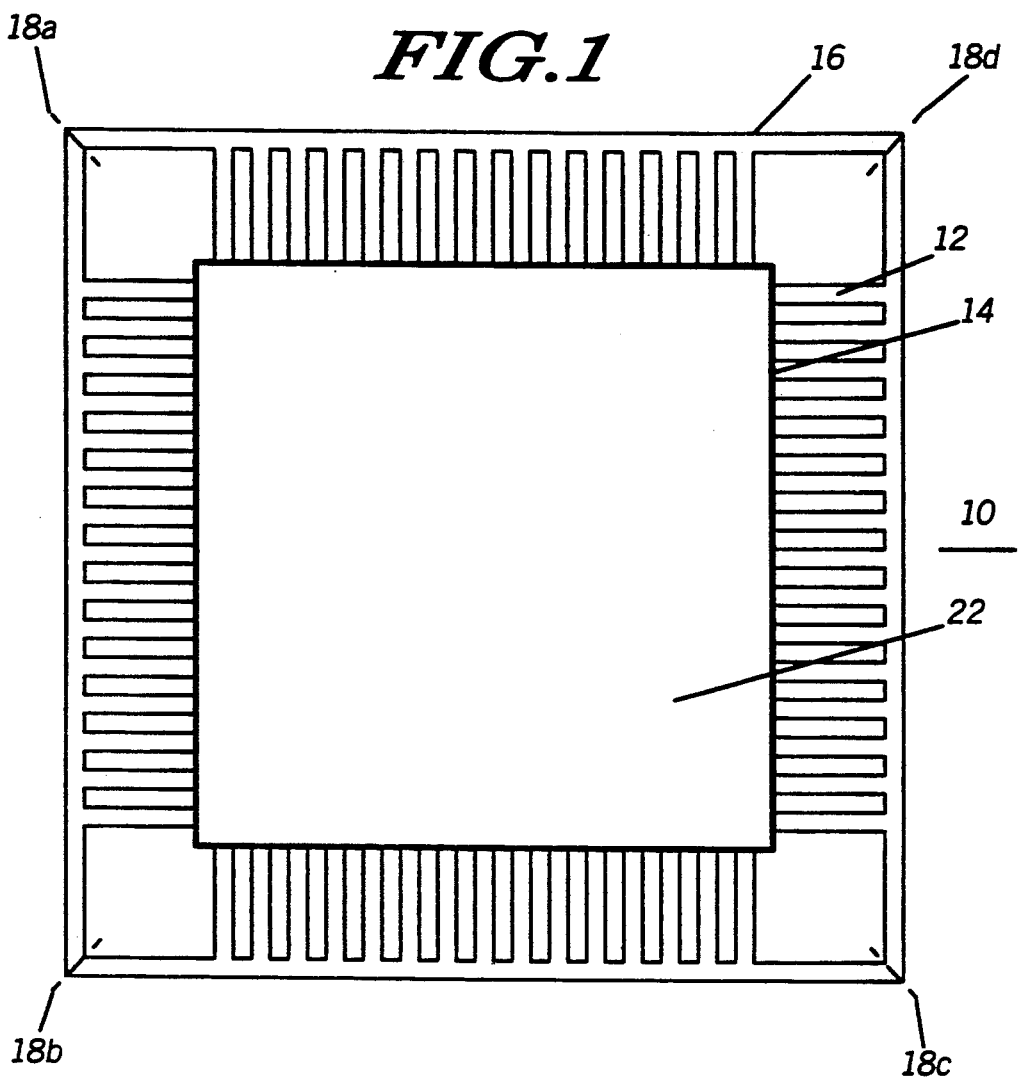
FIG. 1 is a top planar view of a multi-leaded integrated circuit carrier having a retaining ring as found in the prior art.

Referring to FIG. 1, a chip carrier 10, having a plurality of closely spaced leads 12, extending from a plurality of sides 14 of the carrier 10 is illustrated. A typical carrier device has a rectilinear footprint with the leads extending from the four sides of the rectangle chip carrier body 22. As part of the same metallic, or made from another (i.e. plastic) material, a ring or frame 16, attaches to or forms the periphery of the leads 12. After the chip carrier 10 is delivered to an assembly site in this configuration for use in a tape pack form, the corners 18a-d may be cut to facilitate later forming of the leads. In addition, the manufacturer of the chip carrier package may also pre-score the leads 12 to form the notches in order to eliminate a later scoring step at the assembly site.

Figure 2A:
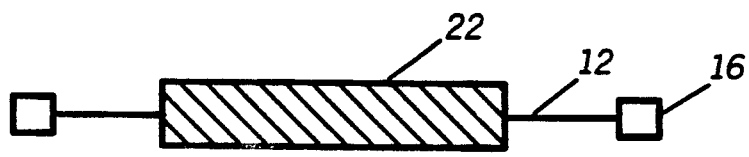
FIGS. 2a-d are steps for retaining the ring through the soldering process in accordance with the present invention.
Figure 2B:
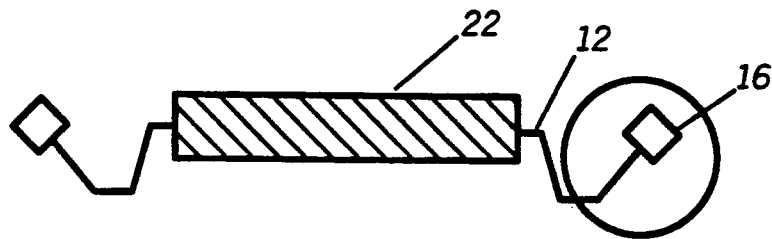
Figure 2C:
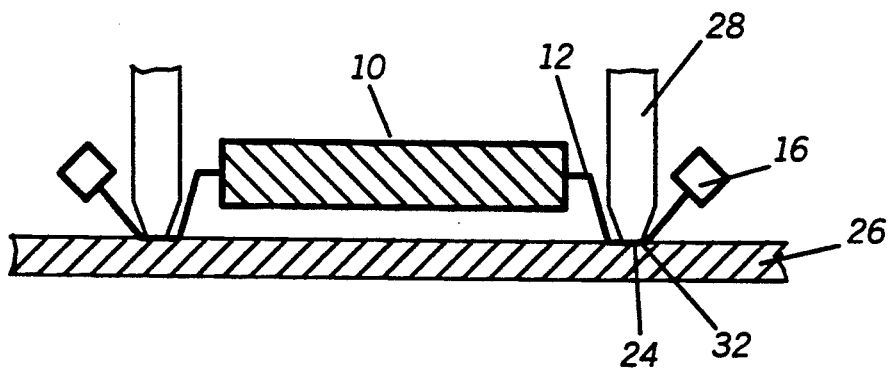

Referring to FIGS. 2a-d, a side view of the chip carrier 10 with the retaining ring of FIG. 1 is shown for use at a robotic workstation site or a functional equivalent. In FIG. 2a, the starting work piece will be the chip carrier of FIG. 1 having a chip carrier body 22 attached to a plurality of straight leads 12, which are retained by the retaining ring or frame 16. In the step of FIG. 2b, a forming tool in a workstation site will bend the straight lead 12, to a suitable shape such as a modified "U" for later placement on a substrate or a PCB for use in a communication device such as a radio. According to the invention, the retaining ring or frame 16 remains intact during this form stage.

Figure 3:
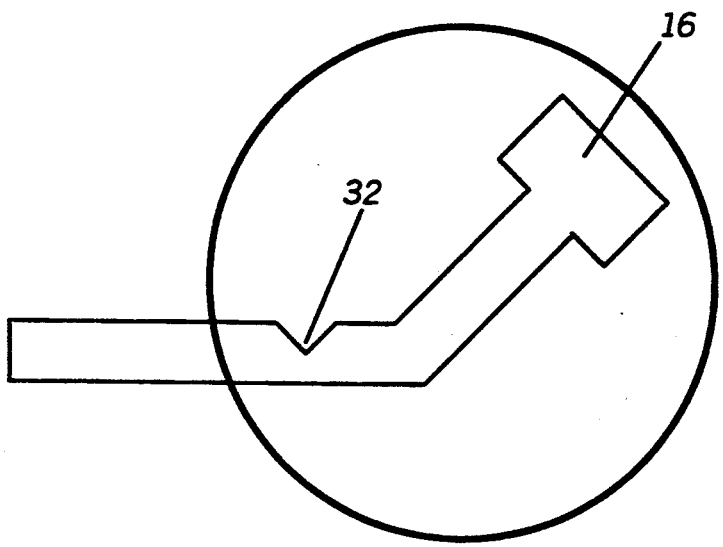
FIG. 3 is a detail of a scored lead of FIG. 2b in accordance with the present invention.

Referring to FIG. 3, an enlargement of the bent lead, 12, is illustrated to show an additional step. A robot places the device in the form tool. The form tool will shape (form) and score the lead to make or groove a notch 32, at the top, bottom, or both sides of the lead 12. As before, the retaining ring 16, is still intact. Hence contrary to the conventional method of shearing the leads along with the retaining ring, the plurality of leads are scored instead of sheared. The robot then moves the device from the form tool to the placement site.

Referring back to FIGS. 2a-d and more particularly to FIG. 2c, the conventional steps of placement and reflow of the carrier device 10 will be followed but still with the retaining ring 16 being intact. After solder flux has been deposited, dipped, or otherwise applied on the bent portion 24 of the lead 12, the chip carrier 10 is placed on a substrate or a printed circuit board 26, where the plurality of bent leads 12 will be positioned on top of corresponding printed lines of the substrate or printed circuit board 26. As part of the following process, hot bar thermodes 28 or a non-contact solder reflow device (i.e. laser) will reflow the solder between the carrier 10 and the substrate or the PC board 26 at a point before the notch 32.

Figure 2D:
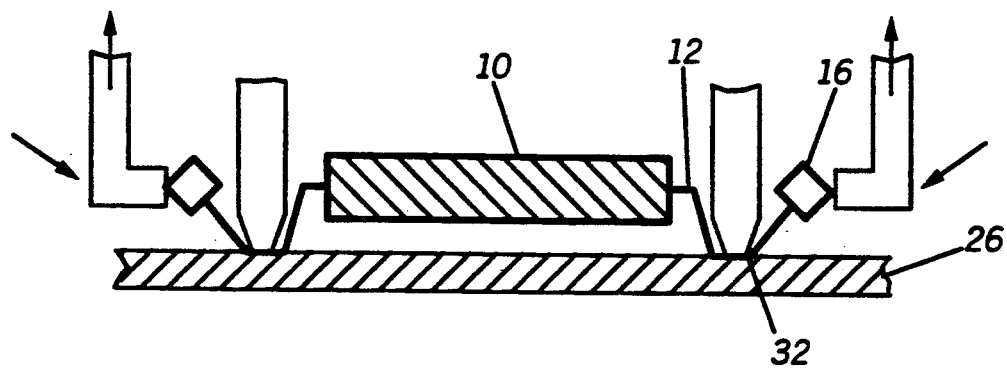

In FIG. 2d, after the carrier 10 has been soldered to the PC board or substrate 26, the leads 12 of the carrier 10, from and including the ring or frame 16 to the notch 32 will be trimmed, puller or otherwise removed appropriately by the robot to avoid any mishandling by a human operator in this or previous steps since the leads are so fine and closely spaced.

In summary, the present invention utilizes a robotic workstation site to avoid mishandling of the fine and closely spaced leads of a chip carrier. Instead of the conventional shearing of the leads and retaining ring before bent leads are formed on site, the retaining ring or frame will remain intact throughout the entire soldering process. Placement and reflow of the chip carrier will be followed as in the conventional method but with the ring still being intact. Once the chip carrier has been formed, scored, placed, and reflowed on site, the retaining ring with any additional lead lengths will be removed and disposed of. Therefore by not removing the retaining ring or frame until after reflow, the integrity of the lead geometry will be increased to prevent lead damage.

What is claimed is:

1. A method of mounting an integrated circuit carrier having a plurality of straight leads retained by an integral frame, comprising the steps of:
    bending said plurality of straight leads of said carrier to form a plurality of bent leads still retained by said frame;
    scoring a portion of said plurality of bent leads to form a notch on each bent lead;
    solder fluxing, placing, and reflowing a portion of said leads, against corresponding printed lines on a printed circuit surface, wherein said portion of said leads is between said integrated circuit carrier and said notch; and
    removing a remainder portion of said plurality of leads and said frame by severing said leads at said notch.

2. The method of claim 1 wherein said solder fluxing, placing, and reflowing step comprises mounting said plurality of bent leads of said integrated circuit carrier against corresponding printed lines on a printed circuit board.

3. The method of claim 1 wherein said solder fluxing, placing, and reflowing step comprises mounting said plurality of bent leads of said integrated circuit carrier against corresponding printed lines on a printed circuit substrate.

4. The method of claim 1 wherein said scoring step comprises scoring a top portion of said plurality of bent leads to form a notch on each bent lead.

5. The method of claim 1 wherein said scoring step comprises scoring a bottom portion of said plurality of bent leads to form a notch on each bent lead.

6. The method of claim 1 wherein said scoring step comprises scoring a top and bottom portion of said plurality of bent leads to form a notch on both sides of each bent lead.

7. The method of claim 1 wherein said scoring comprises grooving a notch on at least one side of each lead.

8. A method of mounting an integrated circuit carrier having a plurality of straight notched leads retained by an integral frame, comprising the steps of:
    bending said plurality of straight notched leads of said carrier to form a plurality of bent notched leads still retained by said frame;
    solder fluxing, placing, and reflowing a portion of said leads against corresponding printed lines on a printed circuit surface, wherein said portion of said leads is between said integrated circuit carrier and said notch; and
    removing a remainder portion of said plurality of leads and said frame by severing said leads at said notch.

9. A method of mounting an integrated circuit carrier having a plurality of straight leads retained by an integral rectangular frame, comprising the steps of:
    cutting at least one corner of said rectangular frame to facilitate manipulations of said plurality of straight leads still substantially retained by said cut frame;
    bending said plurality of straight leads to form a plurality of bent leads still substantially retained by said cut frame;
    scoring a portion of said plurality of bent leads to form a notch on each lead;
    solder fluxing, placing, and reflowing a portion of said leads still substantially retained by said cut frame of said integrated circuit carrier, against corresponding printed lines on a printed circuit surface, wherein said portion of said leads is between said integrated circuit carrier and said notch; and
    removing a remainder portion of said plurality of leads and said frame by severing said leads at said notch.

* * * * *